(12) United States Patent
Schreiber

(10) Patent No.: US 6,298,471 B1
(45) Date of Patent: Oct. 2, 2001

(54) INTERCONNECT MINIMIZATION IN PROCESSOR DESIGN

(75) Inventor: Robert S. Schreiber, Palo Alto, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/378,295

(22) Filed: Aug. 20, 1999

(51) Int. Cl.$^7$ ........................................... G06F 17/50
(52) U.S. Cl. ................................................ 716/10
(58) Field of Search .................................. 716/2, 8, 9, 10

(56) References Cited

U.S. PATENT DOCUMENTS 5,784,287  7/1998  Scepanovic et al. ................ 716/9

OTHER PUBLICATIONS

Aditya et al., "Elcor's Machine Description System: Version 3.0," HPL–98–128, Oct. 1998, pp. 1–75.
Rau et al., "Machine–Description Driven Compilers for EPIC Processors," HP Laboratories Technical Report, HPL–98–40, Sep. 1998, pp. 1–82.
Kathail et al., "HPL PlayDoh Architecture Specification: Version 1.0," HP Laboratories Technical Report, HPL–93–80, Feb. 1994, pp. 1–48.
Rainer Leupers, Peter Marwedel, "Retargetable Generation of Code Selectors from HDL Processor Models," IEEE, 1997, pp. 140–144.
George Hadjiyiannis, Silvina Hanono, Srinivas Devadas, "ISDL: An Instruction Set Description Language for Retargetability," ACM, 1997, pp. 299–302.
Gyllenhaal et al., "HMDES Version 2.0 Specification," Hewlett Packard Laboratories Technical Report IMPACT–96–3, (Published before Aug. 20, 1999).
Hadjiyiannis et al., "A Methodology for Accurate Performance Evaluation in Architecture Exploration." (Published before Aug. 20, 1999).
Hoogerbrugge et al., "Automatic Synthesis of Transport Triggered Processors." (Published before Aug. 20, 1999).
Corporaal et al., "Move: A Framework for High–Performance Processor Design," ACM, 1991, pp. 692–701.
Corporaal et al., "Cosynthesis with the MOVE Framework." (Published before Aug. 20, 1999).
Lanneer et al, "Chapter 5—Chess: Retargetable Code Generation for Embedded DSP Processors," Code Generation for Embedded Processors, Kluwer Academic Publications, pp. 85–102. (Published before Aug. 20, 1999).
Fauth, "Chapter 8—Beyond Tool–Specific Machine Descriptions," Code Generation for Embedded Processors, Kluwer Academic Publications, pp. 138–152. (Published before Aug. 20, 1999).
Devadas et al., "Algorithms for Hardware Allocation in Data Path Synthesis," IEEE, Jul. 1989, vol. 8, No. 7, pp. 768–781.
Cloutier et al., "The Combination of Scheduling, Allocation, and Mapping in a Single Algorithm," 27$^{th}$ ACM/IEEE Design Automation Conference, 1990, pp. 71–76.
Quinton et al., *Systolic Algorithms & Architectures*, Prentice Hall, 1991, pp. 283–339.

(List continued on next page.)

Primary Examiner—Trong Phan

(57) ABSTRACT

Methods and apparatus are described for optimizing interconnections between busses and function units and registers. The method includes identifying each bus in a plurality of busses and at least one hardware component to which each bus is assigned for a given operation. At least two bus assignments are identified for which different operations occur on the same hardware component. Hardware components are assigned for different operations occurring on the same hardware component to the same bus. The optimization process can be efficiently carried out using conventional algorithms for solving assignment problems. Use of these assignment problem algorithms provides an efficient and reliable way of optimizing the bus assignments.

18 Claims, 11 Drawing Sheets

OTHER PUBLICATIONS

Park et al., "Sehwa: A Software Package for Synthesis of Pipelines from Behavioral Specifications," IEEE, Mar. 1988, vol. 7, No. 3, pp. 356–370.

Wilson et al., "An ILP Solution for Simultaneous Scheduling, Allocation, and Binding in Multiple Block Synthesis," IEEE, 1994, pp. 581–586.

Wilson et al., "An ILP Solution for Optimum Scheduling, Module and Register Allocation, and Operation Binding in Datapath Synthesis," OPA, 1995, pp. 21–36.

Chang et al., "Using Integer Linear Programming for Instruction Scheduling and Register Allocation in Multi–Issue Processors," Computers Math. Applic., vol. 34, No. 9, 1997, pp. 1–14.

Paulin et al., "Force–Directed Scheduling for the Behavioral Synthesis of ASIC's," *IEEE*, Jun. 1989, vol. 8, No. 6, pp. 661–679.

Rim et al., "Optimal and Heuristic Algorithms for Solving the Binding Problem," Madison, WI, Sep. 10, 1993.

| Cycle \ Bus | B1 | B2 | B3 |
|---|---|---|---|
| 0 | DT1 | DT2 | DT3 |
| 1 | DT4 | DT5 | DT6 |
| 2 | DT7 | DT8 | DT9 |
| 3 | DT10 | DT11 | DT12 |

FIG. 5

| Cycle \ Bus | B1 | B2 | B3 |
|---|---|---|---|
| 0 | DT1 | DT2 | DT3 |
| 1 | DT6 | DT5 | DT4 |
| 2 | DT8 | DT9 | DT7 |
| 3 | DT12 | DT10 | DT11 |

U $$\begin{bmatrix} 1 & 0 & 0 & 1 & 1 & \cdots \\ 0 & 0 & 0 & 0 & 0 & \cdots \\ 0 & 1 & 1 & 0 & 0 & \cdots \\ 0 & 0 & 0 & 0 & 0 & \cdots \\ 0 & 0 & 0 & 0 & 0 & \cdots \\ 0 & 0 & 0 & 0 & 0 & \cdots \\ \cdot & \cdot & \cdot & \cdot & \cdot & \\ \cdot & \cdot & \cdot & \cdot & \cdot & \\ \cdot & \cdot & \cdot & \cdot & \cdot & \end{bmatrix}$$

U $$\begin{bmatrix} 0 & 0 & 0 & 0 & 0 & \cdots \\ 1 & 1 & 0 & 0 & 0 & \cdots \\ 0 & 0 & 0 & 0 & 0 & \cdots \\ 0 & 0 & 0 & 0 & 0 & \cdots \\ 0 & 1 & 0 & 1 & 1 & \cdots \\ 0 & 0 & 0 & 0 & 0 & \cdots \\ \cdot & \cdot & \cdot & \cdot & \cdot & \\ \cdot & \cdot & \cdot & \cdot & \cdot & \\ \cdot & \cdot & \cdot & \cdot & \cdot & \end{bmatrix}$$

U $$\begin{bmatrix} 1 & 0 & 0 & 1 & 1 & \cdots \\ 0 & 0 & 0 & 0 & 0 & \cdots \\ 0 & 0 & 0 & 0 & 0 & \cdots \\ 0 & 1 & 1 & 0 & 0 & \cdots \\ 0 & 0 & 0 & 0 & 0 & \cdots \\ 0 & 0 & 0 & 0 & 0 & \cdots \\ \cdot & \cdot & \cdot & \cdot & \cdot & \\ \cdot & \cdot & \cdot & \cdot & \cdot & \\ \cdot & \cdot & \cdot & \cdot & \cdot & \end{bmatrix}$$

U $$\begin{bmatrix} 0 & 0 & 0 & 0 & 0 & \cdots \\ 0 & 0 & 0 & 0 & 0 & \cdots \\ 0 & 0 & 0 & 0 & 0 & \cdots \\ 1 & 0 & 1 & 0 & 0 & \cdots \\ 0 & 1 & 0 & 1 & 1 & \cdots \\ 0 & 0 & 0 & 0 & 0 & \cdots \\ \cdot & \cdot & \cdot & \cdot & \cdot & \\ \cdot & \cdot & \cdot & \cdot & \cdot & \\ \cdot & \cdot & \cdot & \cdot & \cdot & \end{bmatrix}$$

B $$\begin{bmatrix} 0 & 1 & 0 & 0 & 0 & 0 & \cdots \\ 0 & 1 & 0 & 0 & 1 & 0 & \cdots \\ 0 & 0 & 0 & 0 & 0 & 0 & \cdots \\ 0 & 0 & 0 & 0 & 1 & 0 & \cdots \\ 0 & 0 & 0 & 0 & 1 & 0 & \cdots \\ \cdot & \cdot & \cdot & \cdot & \cdot & \cdot & \\ \cdot & \cdot & \cdot & \cdot & \cdot & \cdot & \\ \cdot & \cdot & \cdot & \cdot & \cdot & \cdot & \\ \cdot & \cdot & \cdot & \cdot & \cdot & \cdot & \end{bmatrix}$$

$A_{co}$ $$\begin{bmatrix} 0 & 0 & 0 & 0 & 2 & 0 & \cdots \\ 0 & 0 & 0 & 0 & 0 & 0 & \cdots \\ 0 & 1 & 0 & 0 & 1 & 0 & \cdots \\ 0 & 0 & 0 & 0 & 0 & 0 & \cdots \\ 0 & 0 & 0 & 0 & 0 & 0 & \cdots \\ \cdot & \cdot & \cdot & \cdot & \cdot & \cdot & \\ \cdot & \cdot & \cdot & \cdot & \cdot & \cdot & \\ \cdot & \cdot & \cdot & \cdot & \cdot & \cdot & \end{bmatrix}$$

FIG. 12A U $A_0$

B $\begin{bmatrix} 1 & 0 & 0 & 1 & 1 & . & . & . \\ 0 & 0 & 0 & 0 & 0 & . & . & . \\ 0 & 1 & 1 & 0 & 0 & . & . & . \\ 0 & 0 & 0 & 0 & 0 & . & . & . \\ 0 & 0 & 0 & 0 & 0 & . & . & . \\ 0 & 0 & 0 & 0 & 0 & . & . & . \\ . & . & . & . & . & . & . & . \\ . & . & . & . & . & . & . & . \end{bmatrix}$

U $\begin{bmatrix} 0 & 1 & 0 & 0 & 0 & 0 & . & . \\ 1 & 1 & 0 & 0 & 0 & 0 & . & . \\ 0 & 0 & 0 & 0 & 0 & 0 & . & . \\ 1 & 0 & 0 & 0 & 0 & 0 & . & . \\ 1 & 0 & 0 & 0 & 0 & 0 & . & . \\ . & . & . & . & . & . & . & . \\ . & . & . & . & . & . & . & . \end{bmatrix}$

FIG. 13

$A_{co}^P$ $\begin{bmatrix} 2 & 1 & 0 & 0 & 0 & . & . \\ 0 & 0 & 0 & 0 & 0 & . & . \\ 1 & 1 & 0 & 0 & 0 & . & . \\ 0 & 0 & 0 & 0 & 0 & . & . \\ 0 & 0 & 0 & 0 & 0 & . & . \\ . & . & . & . & . & . & . \\ . & . & . & . & . & . & . \end{bmatrix}$

FIG. 14 U $A_0 \vee A_1^P$ $\begin{bmatrix} 1 & 1 & 0 & 1 & 1 & . & . & . \\ 1 & 1 & 0 & 0 & 0 & . & . & . \\ 0 & 1 & 1 & 0 & 0 & . & . & . \\ 0 & 0 & 0 & 0 & 0 & . & . & . \\ 0 & 0 & 0 & 0 & 0 & . & . & . \\ 0 & 0 & 0 & 0 & 0 & . & . & . \\ . & . & . & . & . & . & . & . \\ . & . & . & . & . & . & . & . \end{bmatrix}$

126

B

INTERCONNECT MINIMIZATION IN PROCESSOR DESIGN

RELATED APPLICATION DATA

This patent application is related to the following U.S. patent applications, commonly assigned and filed concurrently with this application:

U.S. patent application No. 09/378,298, entitled PROGRAMMATIC SYNTHESIS OF PROCESSOR ELEMENT ARRAYS, by Robert S. Schreiber, Bantwal Ramakrishna Rau, Shail Aditya Gupta, Vinod Kumar Kathail, and Sadun Anik; and U.S. patent application No. 09/378,431, entitled FUNCTION UNIT ALLOCATION IN PROCESSOR DESIGN, by Robert S. Schreiber.

These patent applications are hereby incorporated by reference.

BACKGROUND OF THE INVENTIONS

1. Field of the Invention

These inventions relate to processor design, and more specifically to interconnection of hardware components in processor design, such as for systolic processors and application specific integrated processors (ASIPs).

2. Related Art

Processor design is a very time intensive and expensive process. For new and unique processor designs, no automated design techniques exist for selecting and designing the mix of processor components or for efficiently interconnecting those components that would be incorporated into the final processor design. While there exist algorithms incorporated into software packages that can help in designing new processors, such software packages do not give a result which is a final design, let alone an optimal design. Typically, those software packages provide approximate solutions to a design problem, typically leading to additional design effort and over-design to account for the lack of precision in those software packages. Additionally, the design process may start entirely from scratch, which would result in substantial time being consumed analyzing possible design configurations before designing the details of the processor. On the other hand, designing a new processor using preexisting designs necessarily incorporates the design benefits and flaws of the preexisting design, which may or may not be acceptable or optimal for the new design.

All conventional processor design software packages are heuristic in nature. In other words, they rely on design criteria and/or methods that in the past have proven more effective than other criteria or methods. However, in order to apply to more than one processor design or design methodology, such design criteria and methods must be sufficiently general to provide predictable results. Therefore, such heuristic software packages provide relatively high-level solutions without a complete contribution to details of the design. Additionally, heuristic software packages necessarily lead to significant trial and error in an attempt to optimize the processor design. Consequently, design of new processors is time intensive and expensive.

Processors are often designed to incorporate pipelined data paths to speed processing throughput, reduce initiation intervals and to optimize use of the various function units, such as adders, multipliers, comparators, dividers, registers and the like. These data paths are formed from an interconnected assembly of function units and register files. The function units and register files may be interconnected by busses. Because these data paths may include a large number of function units, register files and bus segments, the job of selecting the function units, register files and bus segments is very difficult, to say the least. The task is made more difficult if one desires to find an efficient configuration.

Pipelined data paths are particularly useful in processing iterative instructions, such as those found in instruction loops, and especially nested instruction loops. When considering a subset of situations where the instruction loops are known, such as those used with embedded processors, the task of designing the optimal, low-cost processor still exists because of the large number of different function units, register configurations and bus configurations that are possible. Heuristic software design solutions used for designing processors are not suitable for finding solutions to such multi-dimensional problems. Because there are so many variables to consider, it is too difficult to optimize all of variables to arrive at a suitable solution without great expenditure of time and effort.

SUMMARY OF THE INVENTIONS

The present inventions provide methods and apparatus for more easily and efficiently producing computing systems, for example those incorporating processor arrays having processors with function or execution units, register files, bus arrays, and the like. These methods and apparatus reduce the time required for designing these processors, and reduce the amount of trial and error used in processor design. They find more efficient configurations for interconnecting function units and registers, and they can do so much faster and more reliably than conventional methods and apparatus. They also reduce some of the costs associated with starting the design of a new processor from scratch, which often may be necessary in the design of embedded processors.

These and other aspects of the present inventions are provided by methods and apparatus for assembling a set of hardware component and bus assemblies, such as for an embedded processor having pipelined data paths. The hardware components could be function units such as adders, multipliers, arithmetic logic units, registers and the like. The methods could be carried out on, and the apparatus could include, any manner of equipment, such as computers and other processors including mainframes, workstations, and the like, as well as apparatus containing instructions or data for use in controlling such processors, such as disk drives, removable storage media, and temporary storage. In one aspect of the present inventions, the process includes identifying busses and hardware components to which each bus is assigned for a given operation, and identifying bus assignments for which operations occur on the same hardware component. In the preferred embodiment, at least some of the hardware components for which different operations occur on the same hardware component are assigned to the same bus. With this procedure, the process of designing inter-connects between hardware components is easier and more reliable. The resulting architecture of the processor is improved and the layout of the bus structure is simplified. By way of a simple example, some design techniques may assign different busses to the same set of hardware components where data is being transferred between the hardware components within the set during two different cycles. The present procedure more easily identifies such redundancy and assigns a single bus to the set of hardware components, even though the design may treat the data transfers as separate operations. Therefore, identifying redundant bus structures between hardware components related by common data transfers occurring over different cycles allows for consolidation of those redundant bus structures.

In another preferred form of the inventions, the process includes the steps of comparing a table of bus assignments for each of a number of operations to be carried out over a number of known cycles. The table may be a matrix or other representation of a relationship between a set of busses and hardware components. The hardware components may be function or execution units and registers or register files, or other comparable components. In the preferred embodiment, different matrices will represent the relationships for different cycles. The matrices, or other representations of the relationships, are then processed to identify potential redundancies in the assignment of a bus to one or more hardware components. The bus assignments are then redistributed to reduce or eliminate the redundancies. In one preferred embodiment, the matrices are processed two at a time to optimize the bus assignment and interconnect configuration by solving a conventional assignment problem. For example, the matrix product of a first matrix with the transpose of a second matrix produces a series of numbers in a correlation matrix whose diagonal represents busses having common connections. If the columns of the transposed matrix, representing the bus connections for that matrix, are permuted until the cross product produces a diagonal whose sum is a maximum, the permuted matrix producing the maximum has a bus connection configuration which is optimum relative to the bus configuration of the first matrix. Thus, if the busses and hardware components are connected in accordance with the first matrix and the permuted second matrix for the two cycles represented by those matrices, a more efficient bus interconnect configuration will result compared to the original starting configuration represented by the two original matrices.

In a further preferred form of the invention, correlation matrices are produced for multiple combinations of pairs of the matrices so that each of the original matrices can be permuted to produce a more efficient bus connection configuration. In a particular preferred embodiment, the first matrix and the permuted matrix are OR-ed together to produce an accumulation matrix, which is then used to produce a correlation matrix with a third transposed matrix. The correlation matrix is again used to find a permuted matrix which optimizes the sum of the numbers on the diagonal of the correlation matrix, thereby determining the optimum bus interconnection configuration for the third matrix relative to the accumulation matrix. The optimized third matrix is then OR-ed with the accumulation matrix to produce a new accumulation matrix. Each of the individual optimized, permuted matrices is stored. The process is repeated until all of the individual matrices have been permuted to produce the optimum bus interconnect configuration for that matrix relative to the accumulation matrix against which the permuted matrix was optimized. These permuted matrices produce a bus interconnect configuration that is more efficient than the starting configurations.

In another form of the inventions, a second sweep of the matrices representing the bus interconnect configurations is carried out so that each of the matrices can be optimized relative to all of the others. In the first sweep, the second matrix was permuted and optimized relative to the first matrix, but not any of the others. The last matrix was permuted and optimized relative to all of the preceding matrices. In the second sweep, each matrix will be permuted and optimized in view of all the other matrices. Specifically, a new accumulation matrix will be prepared by OR-ing all of the permuted matrices together except for the first matrix. The new accumulation matrix will then be used to optimize the first matrix. The optimized permuted matrix will then be stored. The other permuted matrices will also be optimized relative to a new accumulation matrix prepared by OR-ing all the permuted matrices but the one to be optimized. At the end of the second sweep, the newly permuted matrices are then stored and used to create the bus interconnect configurations. Alternatively, a final accumulation matrix can be prepared by OR-ing together all of the permuted matrices. The final accumulation matrix represents the bus interconnects with the hardware components.

In another preferred form of the invention, times are identified for each bus in a plurality of busses when the bus is to be connected to a hardware component and combining two or more busses that are connected to the same hardware component at different times into a single bus. In this manner, different busses that may be assigned to the same hardware components, but at different cycles of a process, can be merged into a single bus. Consequently, data transfers occurring at different times but between the same hardware components can occur on the same bus.

BRIEF DESCRIPTION OF THE DRAWINGS

FIG. 5 is a table showing a hypothetical bus-data transfer relationship over several cycles of a computation.

FIG. 6 is a table showing a hypothetical rearrangement of data transfers for the busses and for the several cycles depicted in FIG. 5

FIGS. 9A–9D are matrices depicting the bus and hardware component interconnections represented in the tables of FIGS. 7A–7C.

FIG. 10 is a transpose matrix of the matrix of FIG. 9B to be used in an optimization procedure in accordance with one aspect of the present inventions.

FIG. 11 is a correlation matrix of the matrix of FIG. 9A and the transpose of FIG. 10.

FIGS. 12A and 12B are the matrix of FIG. 9A and a permuted transpose of the matrix of FIG. 9B, respectively.

FIG. 13 is a correlation matrix of the matrices of FIGS. 12A and 12B showing an increased sum of the diagonal of the correlation matrix upon permuting the matrix A1.

FIG. 14 is an accumulation matrix from the matrices of FIGS. 12A and 12B.

DETAILED DESCRIPTION OF THE PREFERRED EMBODIMENTS

The inventions, some of which are summarized above, and defined by the enumerated claims may be better understood by referring to the following detailed description, which should be read in conjunction with the accompanying drawings. This detailed description of a particular preferred embodiment, set out below to enable one to build and use one particular implementation of the invention, is not intended to limit the enumerated claims, but to serve as a particular example thereof. The particular examples set out below are the preferred specific implementations of the interconnect system that can be used for a number of applications and implemented in a number of ways. The inventions, however, may also be applied to other systems as well.

In accordance with several aspects of the present inventions, apparatus and methods are disclosed for selecting hardware components for a processor such as an embedded processor that decreases the time and effort required for processor design. The methods and apparatus also reduce the amount of trial and error used during processor design, and produce a more predictable and definitive result than general heuristic methods. They also improve the architecture of the processor and free up space on the layout of the processor and reduce the cost of the end product. Consequently, these methods and apparatus significantly reduce the cost of design.

Figure 1:
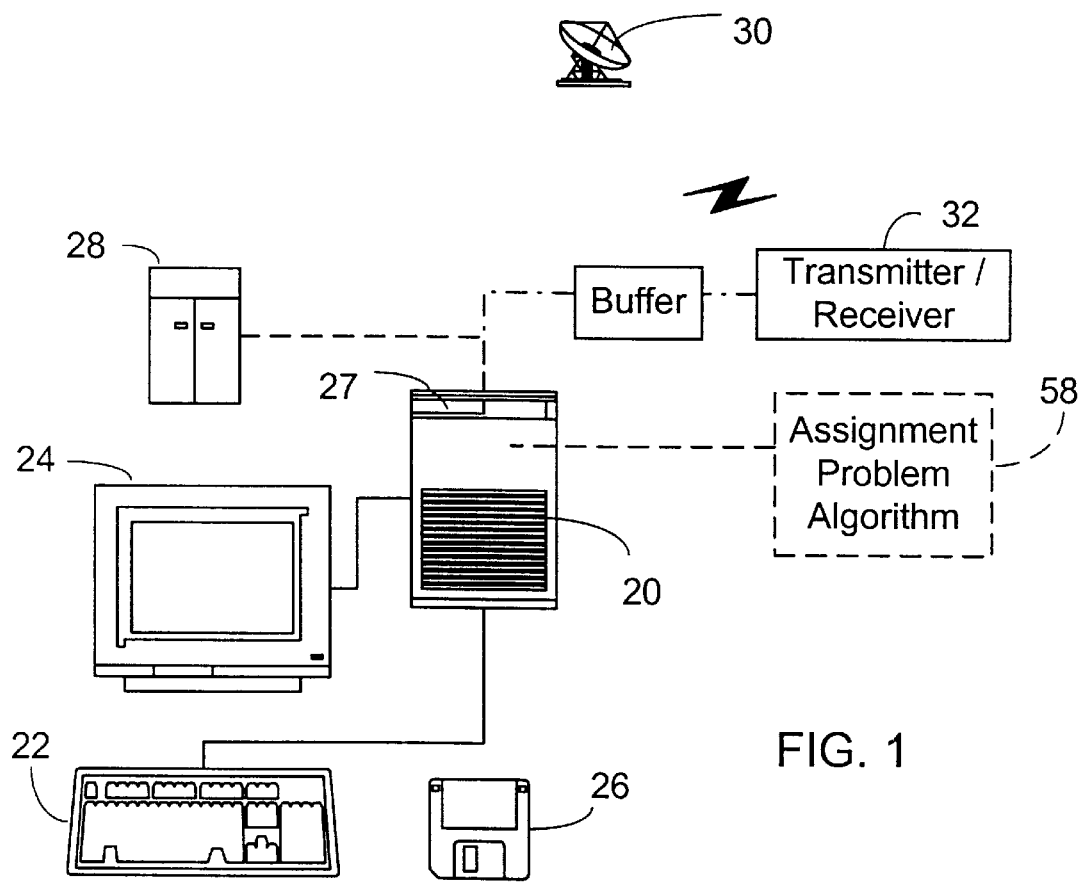
FIG. 1 is a schematic and assembly drawing of an apparatus for selecting hardware components for a processor such as an embedded systolic processor, including apparatus for receiving input to and delivering results from the selection process.

In one aspect of the present inventions, the methods can be carried out on a pre-programmed digital processor, a general-purpose computer or a workstation, such as at 20 (FIG. 1), which can receive input from a conventional keyboard 22. The input can take the form of input data for use by algorithms processed by the computer 20, or other input or information as necessary. Information such as intermediate results, queries, requests for input, final results or other information can be displayed by the computer on a monitor 24 or output, as desired.

The computer 20 can receive applications programs and/or data from a number of different sources, including a removable storage device such as disk 26 for a disk drive 27 or any other movable tangible storage medium, such as portable disk drives and the like. Applications programs and data can also be received from a network host, host processor or mainframe computer 28, or from more remote locations such as off-site servers, over the Internet, or through other conventional communications paths. For example, data can be received from a satellite antenna 30 through a transmitter receiver 32 linked to an input and output port on the computer 20. Other linkages and communications methods can be used with the computer 20 in order to receive data and software, and to transmit data, results and software.

In the following discussion, a number of methods and systems are described that are implemented in programs. The term "programmatic" refers to a system or method embodied in a program or programs implemented in software executed on a computer, in hardwired circuits, or a combination of hardware and software. In the current implementation, the programs as well as the input and output data structures are implemented in software stored on the workstation's memory system. The programs and data structures may be implemented using standard programming languages, and ported to a variety of computer systems having differing processor and memory architectures. In general, these memory architectures are referred to as computer readable media.

Figure 2:
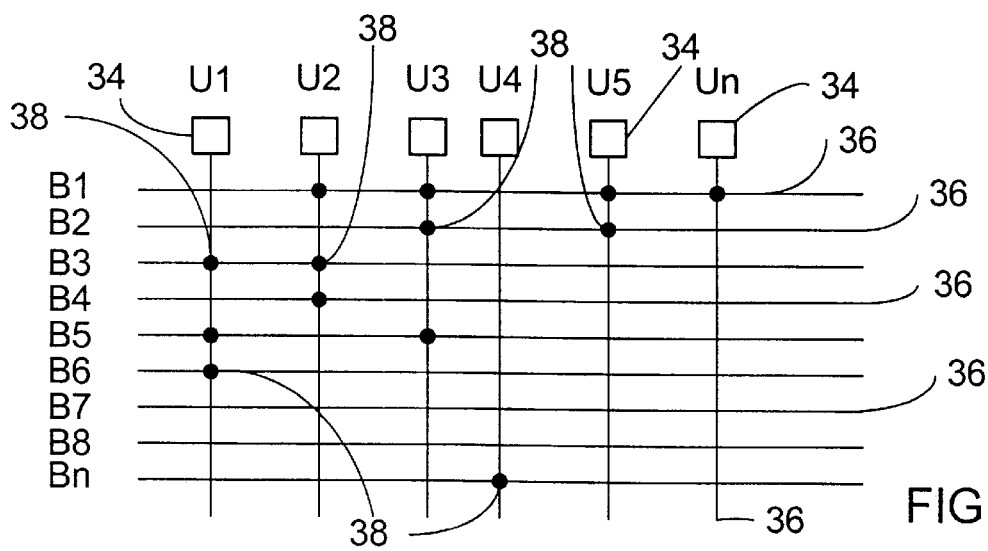
FIG. 2 is a schematic diagram of part of a processor such as a pipelined processor with hardware components and a bus structure connecting the hardware components to each other and/or to other hardware components, that may be designed in accordance with the apparatus and methods of the present inventions.

Particular applications to which the present inventions are directed include designing processors such as embedded processors. Embedded processors are used extensively as controllers or processors for equipment, appliances, entertainment devices, and the like. These processors have predefined functions and operations, and many of the operations are repetitive. These repetitive operations, by their nature, lend themselves to being carried out on function units and registers depicted schematically at 34 (FIG. 2) all arranged in such a way as to move incoming data and transfer the results of operations along a path termed a "pipeline". The pipeline arrangement takes advantage of the natural flow of data through the operations while minimizing register load requests and data transfers. Busses 36 may be used to interconnect the function units and the register files 34 through junctions 38. The present inventions can be used to quickly and inexpensively optimize part of the design of such embedded processors. While the following discussion will focus on embedded processors and their design, with particular emphasis on the interconnection of function units and register files with busses, configured to optimize data pipelining, it should be understood that the inventions described herein may be applicable to the design and manufacture of other processor configurations.

Processors operate based on instructions from a software program or other instruction source. Part of that software program or other instruction source may include a loop body or loop nest represented in FIG. 3 by the sample routine 40. This sample routine would be part of a larger software program or other instruction source, but serves in this instance as a suitable example of a set of calculations that can be carried out on an embedded processor, such as one including an ensemble of function units, register files and possibly busses forming a pipelined data path. The sample routine may include an add operation 42, a multiply operation 44 and an add operation 46 within a loop 48, which in turn is nested within a loop 50. This loop nest can be evaluated and considered along with other requirements to determine possible Initiation Intervals (II) according to which the operations would be carried out on various function units. Initiation Interval may take into account the cycle time required by the equipment or appliance into which the computing unit will be placed. For example, the Initiation Interval may depend at a macro level on the number of pages to be scanned per second in a scanner, the number of sheets to be output per minute by a printer or copier, and the like. It also may depend on a micro level on such factors as recurrences and the like. Using this information, the mix of function units and registers will be determined to carry out the instructions represented by the code, and busses assigned to the function units and registers to permit data transfers. Given an ensemble of function units, register files, and busses, the interconnections of those units will then be determined to preferably minimize the number of individual busses, and to optimize the interconnections between the function units, register files and busses while still carrying out the required data transfers. If the interconnections can be optimized, the cost of manufacturing the processor can be reduced by avoiding inefficient connections, and possibly by reducing the number or complexity of the bus configurations. One preferred approach for doing so is described herein.

Figure 3:
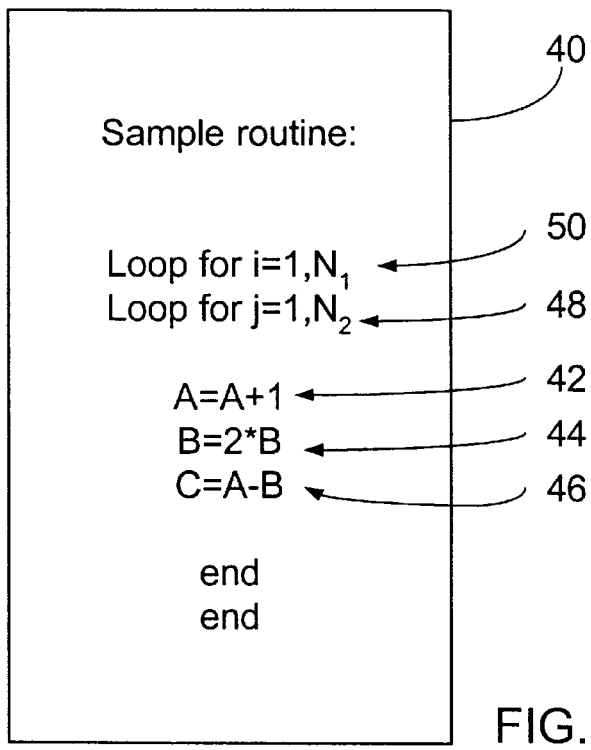
FIG. 3 is a schematic of a sample software routine segment that may be executed in a processor designed using the designs and methods of the present inventions.
Figure 4:
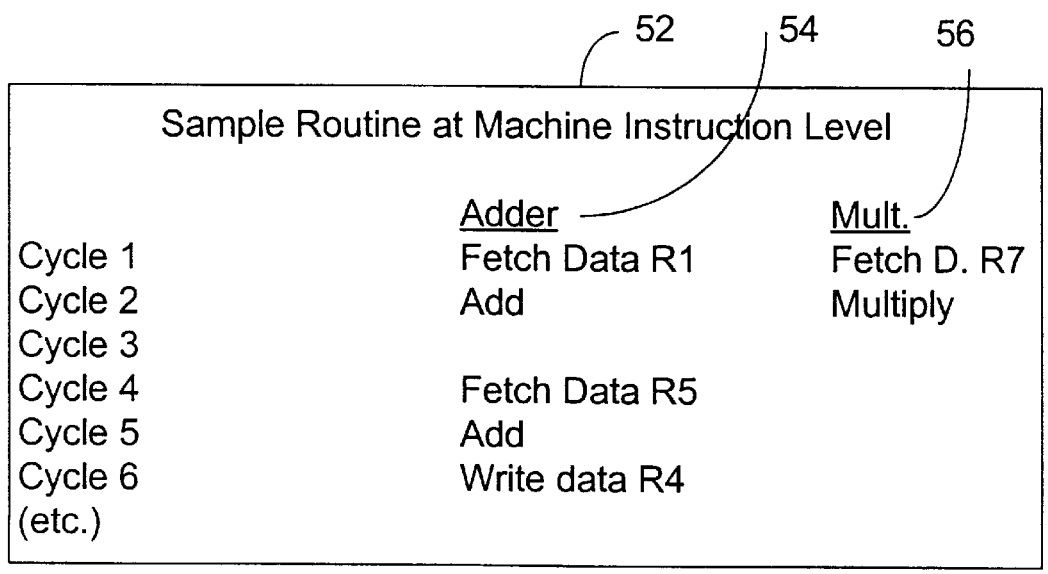
FIG. 4 is a schematic of a machine instruction level sample routine derived from the software routine of FIG. 3.

By way of example, a simple operation will be described to demonstrate the development of a schedule of operations for a loop body, including data transfers, as a function of clock cycles at which they occur. A sample routine includes a number of operations, as shown in FIG. 3, and in this example includes several loops over which the operations will occur. Within a loop, it can be seen that the operations will repeat, especially in pipelined data paths. An initiation interval can be defined which is the number of cycles between the start of one operation of a loop iteration and the start of the next iteration of loop for the same operation, in other words the number of cycles between successive iterations of the loop. The sample routine can be converted into an equivalent sample routine at the machine instruction level depicted as 52 in FIG. 4. The instruction level sample routine 52 identifies the cycle times over which the operations of the inner loop nest 48, including data transfers, could be carried out on possible function units, such as an adder 54 and a multiplier 56. Because data transfers represent a step in the operations, and require a cycle time to be assigned to each data transfer, certain cycles include data transfers between hardware components, such as the Fetch Data operations at Cycle 1, and the Write Data operation at Cycle 6. Specifically, the Fetch Data from Register 1 for the hardware component Adder 54 uses a data transfer on a bus (such as B3 in FIG. 2) connected between the register and the adder, both function units in FIG. 2. This connection occurs at Cycle 1. Another connection occurs at Cycle 1 as well, namely for the transfer between register 7 and the multiplier 56, which may occur on bus B2. Other connections are scheduled at Cycles 4 and 6. Once the operations are analyzed and the relationships between the function units and the registers are defined, busses or other connections will be made to allow the data transfers to occur at the desired cycle time. It is desired to minimize the number of the connections used to achieve these data transfers, because each connection made in the hardware has a cost not only in terms of creation but also in terms of real estate taken up by the bus and its connections.

Given an instruction level sample routine 52 and an initiation interval 11, there are numerous interconnections of busses and hardware components that could be used to make the data transfers defined by the sample routine 40 and instruction level sample routine 52. In accordance with one aspect of the present inventions, an assignment problem algorithm 58 (FIG. 1) is used to find a solution to the optimization problem of identifying the desired interconnections between hardware components and busses to achieve the data transfers defined by the instruction level sample routine. The solution to the interconnect design problem is a series or group of definitions for the interconnections between the busses and the hardware components either on a cycle-by-cycle basis or as a function of the busses and hardware components to which the busses are connected. This information is then used with the hardware definitions and assignments to create a hardware description language for the processor.

Figure 15:
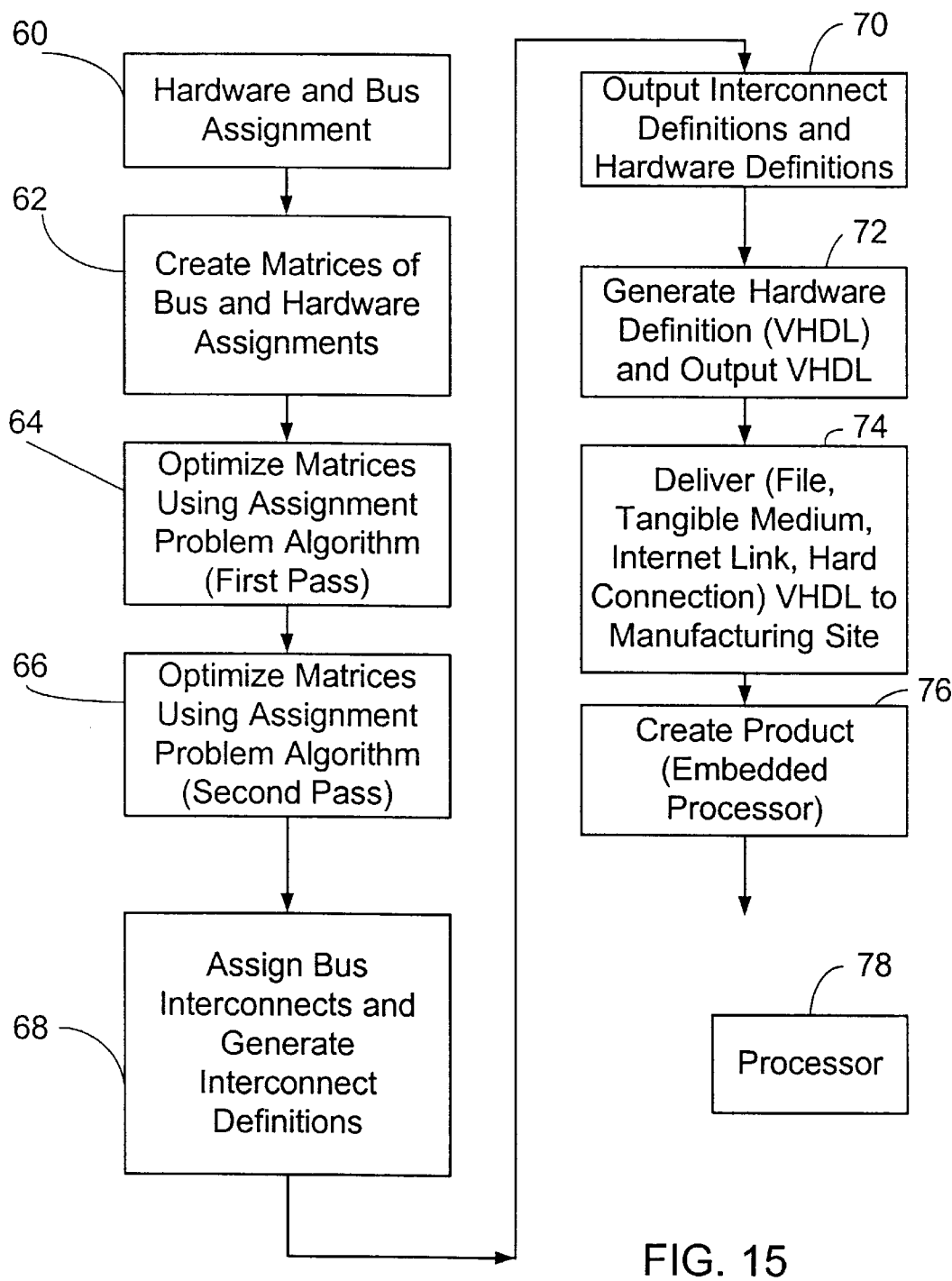
FIG. 15 is a flow chart representing a method or process for reducing the number of interconnects between one or more busses and hardware components and using the information to develop a hardware description language.

In one preferred embodiment of the inventions, a general-purpose computer, workstation or other processor 20 (FIG. 1) may accept as input an instruction program and parameter set 60 (FIG. 15). This information may be input from a keyboard 22, a removable storage medium 26, from a mainframe 28 or from a communications link. The instruction program and parameter set may include the initiation interval or a similar criterion, and a library of the function units and busses or other components that have been scheduled, for example with a modulo scheduler, and assigned to be included in the final processor. The processor 20 will also include, already loaded or retrieved from another source, an algorithm for matrix manipulation and an algorithm for solving an assignment problem for optimizing the interconnects between the busses and the hardware components. These algorithms may be separate routines or a series of routines or may be a single program for carrying out the methods set forth herein. The processor 20 then creates matrices of the bus and hardware data transfer assignments in step 62 using the instruction program and parameter set and definitions provided from step 60. In a first pass, the matrices are optimized using the assignment problem algorithm to minimize to a first approximation the interconnects between the busses and the hardware components (function units and register files) at step 64. In one preferred embodiment, a second pass then further optimizes the interconnects between the busses and the hardware components using the assignment problem algorithm at step 66. Two passes may be optimum, if further passes do not lead to significant optimization. However, it is preferred to do as many passes as can be reasonably done while the results provide further optimization. What is reasonable will depend on the processing costs for doing additional passes compared to the incremental improvements obtained. Moreover, the time savings provided by this method may permit a relatively large number of passes while overall still using up less time in the this part of the design phase compared to conventional techniques. Following the optimization, the bus interconnects are assigned and a set of interconnect definitions are generated at step 68 and the definitions along with the hardware definitions are output at step 70.

Thereafter, the processor 20 or another suitable apparatus generates a hardware description in a standard hardware description language at step 72, such as VHDL, and outputs the hardware description language so that it can be delivered, at step 74, to a manufacturing site. The manufacturing site then creates at step 76 a suitable product such as an embedded processor 78 which incorporates the function units and bus interconnects between the function units and register files, suitable to execute the program for which it was designed.

Considering the methods and apparatus of the present inventions in more detail, it will be assumed for the present discussion that a loop body and an initiation interval have been defined, such as by coded instructions or other means for defining the operations to be carried out on the processor being designed. Once the function units have been allocated and scheduled, such as with a modulo scheduler, every required operation including data transfers has been assigned a start time or cycle number relative to the start time of an iteration. Busses have also been allocated for the scheduled data transfers corresponding to the function units or hardware components scheduled by the modulo scheduler. Therefore, for each cycle within an initiation interval, all of the operations have been scheduled. Some of these operations include data transfers, assigned to the number of busses necessary to carry out the data transfers during the given cycle, and there will typically be data transfers for each cycle within the initiation interval. It then remains to determine, for every cycle, which bus will handle which data transfer, in other words what connections are required between any given bus and the ensemble of hardware components to be included in the processor. Because there is a cost associated with the building of a bus and the connections made between the bus and a given hardware component, it is desirable to minimize the number of connections to a bus, and to minimize the number of busses.

It should be understood that several outer boundaries apply to the number of busses and the number of connections to the busses. For example, there will be a minimum number of discrete busses used, which number is determined by the largest number of data transfers taking place within the given initiation interval. For other cycles within the initiation interval, it is possible that not all of the busses will be used if fewer than the maximum number of data transfers are occurring during the other cycles. If B is the minimum number of discrete busses required, B! (B factorial) represents the number of choices for connections to the busses for each cycle, assuming that the first cycle within a given initiation interval has a defined connection assignment. Additionally, the number of possible bus connections is given by B! raised to the (II−1) power. Here, II represents the initiation interval, or the number of cycles that occur before an iteration starts again. Consequently, there are a large number of possible interconnect combinations for the busses, and it is desirable to have an efficient method for deciding how to interconnect the busses and the hardware components in order to carry out the operations defined by the program code, or other instructions to be processed by the processor.

While it is possible that all the function units and register files can be connected to all of the busses, thereby eliminating any need to decide how to connect the busses, such a combination is too expensive to manufacture and creates an inefficient processor design. Alternatively, data transfers can be assigned to busses according to which data transfers are required for a given cycle using a simple sequential assignment 80 (FIG. 5). For example, during Cycle 0, data transfer 1 (DT1) is assigned to bus 1 (B1), data transfer 2 (DT2) is assigned to bus 2 (B2) and data transfer 3 (DT3) is assigned to bus 3 (B3). This assignment sequence continues, for example if the next data transfer (DT4) occurs during Cycle 1, DT4 is assigned to B1, and so on. This simple approach is not very efficient, especially if data transfer 1 occurring over bus 1 is between the same hardware components as data transfer 6. With the assignment represented at 80 in FIG. 5, the connections to bus 3 for data transfer 6 may not be necessary and can be handled by the connections already established for data transfer 1 on bus 1, and bus 3 may never have to be connected to the hardware components to which bus 1 is already assigned. For example, analysis may show that data transfer 6 to already be accommodated by the connections already established for data transfer 1 on bus 1 during Cycle 0, and that data transfer 4 is already accommodated by connections to bus 3 already established for data transfer 3 during Cycle 0, as represented at 82 in FIG. 6. In summary, once a set of data transfers are assigned to respective busses, such as for Cycle 0, or any other Cycle chosen first, it is preferable to take advantage of the existing assignment when assigning data transfers to busses in other cycles.

In one preferred embodiment, it is assumed that the number of busses and the number of hardware components have already been selected, and the connections between the busses and the hardware components remain to be determined. For example, the data transfers generated by a modulo scheduler for a given program code and ensemble of function units and generic busses can be depicted by a truth table or function unit-bus array. An example of such an array is provided in FIGS. 7A–7C for a first Cycle 0, a second Cycle 1 and on out to the last Cycle II−1, represented in FIG. 7C. In the first table 84 for Cycle 0, the modulo scheduler has assigned data transfers to occur on Bus 1 between function units U1, U4 and U5. Other data transfers may be scheduled for Cycle 0, such as represented for Bus 3 between function units U2 and U3. No other data transfers are shown as being scheduled for function units U1–U5, but it should be understood that other data transfers could be scheduled during Cycle 0 for the other busses for function units U6–Un, where "n" is the total number of hardware components. When considering the data transfers scheduled for the remaining cycles, it can be seen that some of the same hardware components have also been connected to other busses, as indicated by the solid dots corresponding to other bus numbers. For example, during Cycle 1, data transfers occur between units U4 and U5 and a Bus 5, as shown in the array 86, which data transfer would ordinarily require a connection between them. Similarly, data transfers will occur between those same units on a Bus 6 during the last cycle, Cycle II−1, as shown in array 88. If the scheduling can modify or reassign the data transfer to occur not on Bus 5 but instead on Bus 1 for Cycle 1, and if the data transfer currently scheduled for Bus 6 in Cycle II−1 can be modified or reassigned to be on Bus 1, data transfers between hardware components U2, U4 and U5 can be accommodated by Bus 1 for those later cycles. Units U4 and U5 will have already been connected to Bus 1, and a connection for U2 can be added to accommodate the data transfers for hardware component U2 in Cycles 1 and II−1. In doing so, five redundant bus interconnections may have been eliminated. Therefore, it is desirable to minimize the number of connections between the different busses and the hardware components in order to minimize the cost inherent in each connection.

Figure 7A:
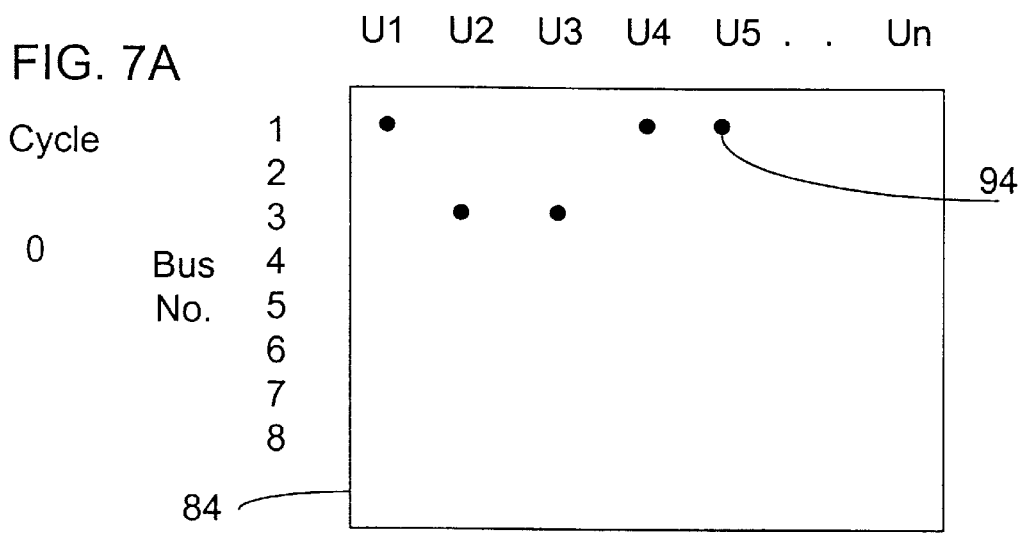
FIGS. 7A–7C are tables depicting bus and hardware component interconnections as a function of the cycle time relative to an arbitrary cycle start and having several redundancies.
Figure 7B:
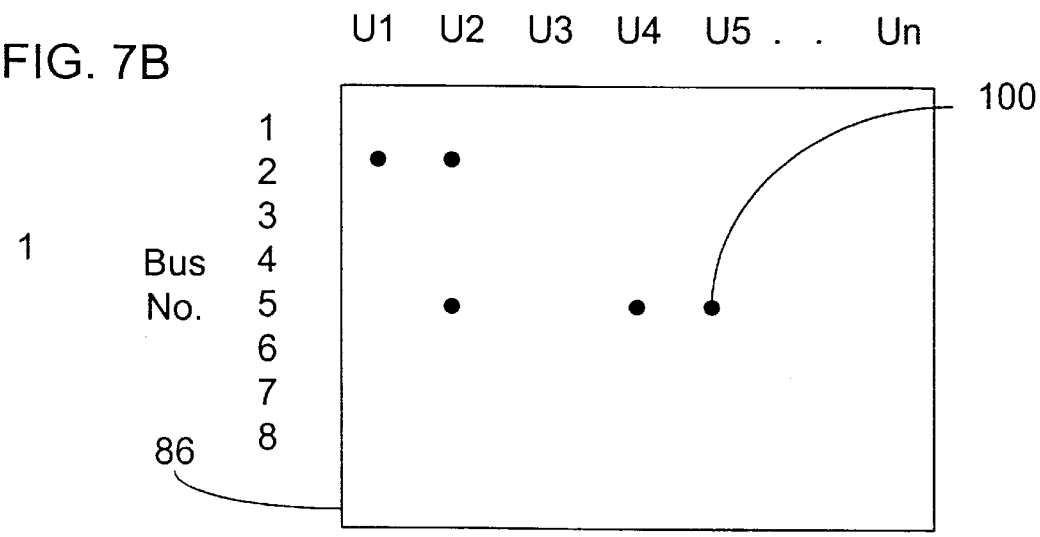
Figure 7C:
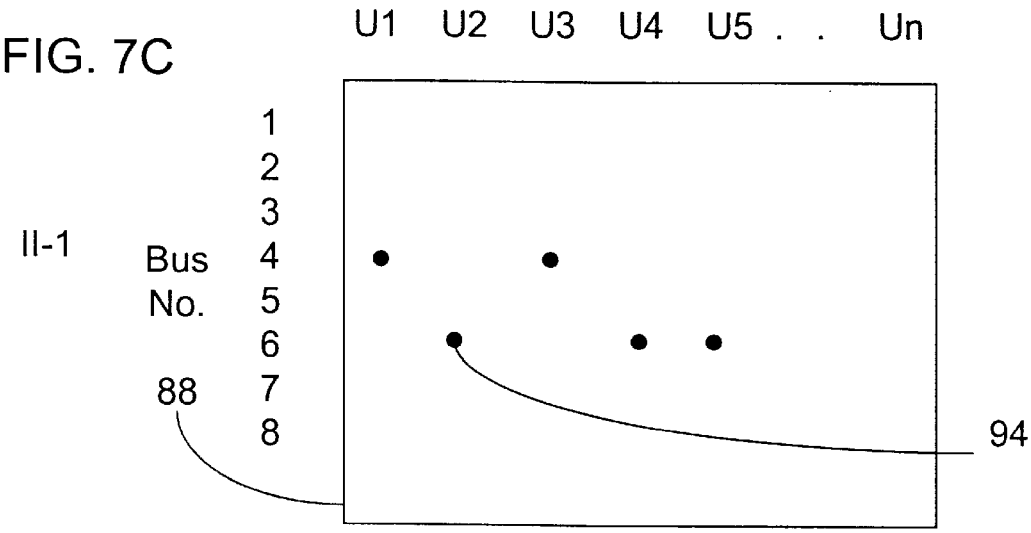

The arrays 84–88 shown in FIGS. 7A–7C graphically demonstrate possible redundancies in data transfer assignments between busses and hardware components. The arrays also can be used to visualize possible ways to minimize redundancies in those assignments. In one preferred form of the inventions, the data transfer operations, represented by the bus and hardware component relationships depicted in FIGS. 7A–7C, are analyzed to identify bus assignments for which different operations occur on the same hardware components. For example, it can be seen in FIGS. 7A–7C that hardware components U4 and U5 have data transfer operations in different cycles with different bus assignments. These are considered different operations since they occur during different cycles.

Figure 8A:
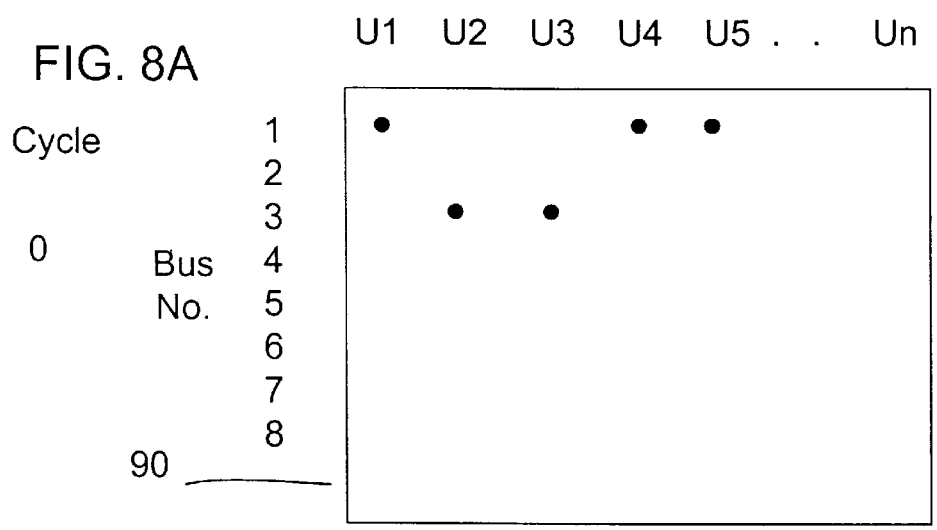
FIGS. 8A–8C are tables depicting bus and hardware component interconnections as a function of the cycle time relative to an arbitrary cycle start after some permutations to account for the redundancies depicted in FIGS. 7A–7C.
Figure 8B:
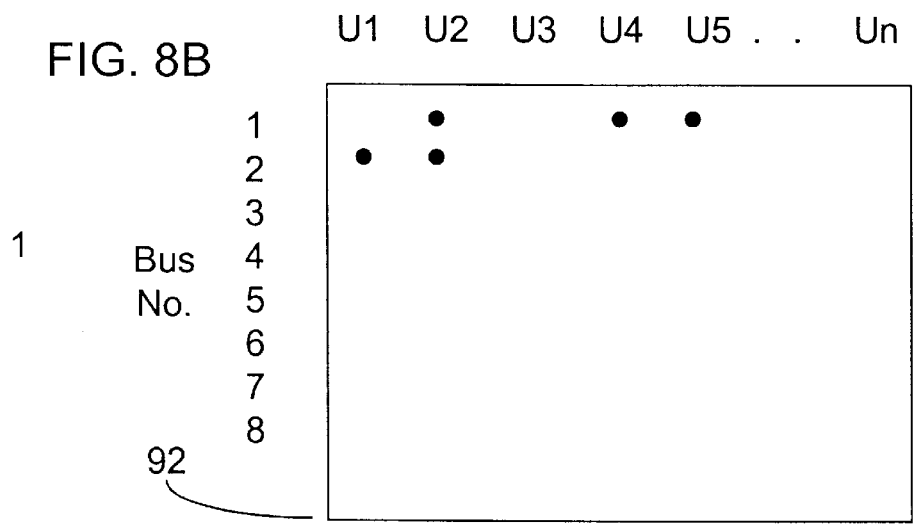
Figure 8C:
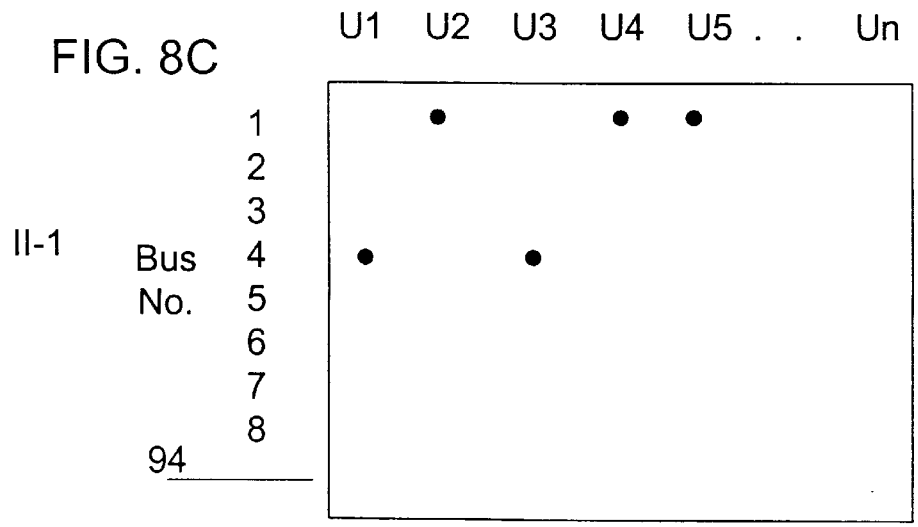

These data transfer interconnects are candidates for optimization, for example with the data transfer interconnects to be made with those hardware components on Bus 1 to achieve the data transfers scheduled for Cycle 0. Preferably, these data transfer operations for hardware components U4 and U5 during the different cycles are assigned to the same bus, for example Bus 1, as depicted at 92 in FIG. 8B. With such a re-assignment, connections will be made between Bus 1 and hardware components U1, U2, U4 and U5. The connections between Bus 1 and U1 will permit the data transfer depicted in array 90 in FIG. 8A. The connections between Bus 1 and U2 will permit the data transfers depicted in arrays 92 and 94 in FIGS. 8B and 8C, respectively. The connections between Bus 1 and U4 and U5 will permit the the data transfers on Bus 1 during Cycle 0, Bus 5 during Cycle 1 and on Bus 6 during Cycle II−1. Also with such a re-assignment, the busses in Cycle 1 and Cycle II−1 are re-arranged to accomodate the new Bus 1. (Note that no dots are depicted in FIGS. 8B or 8C for a data transfer on Bus 1 for U1 since other data transfers are scheduled for U1 during those cycles.)

Figure 16:
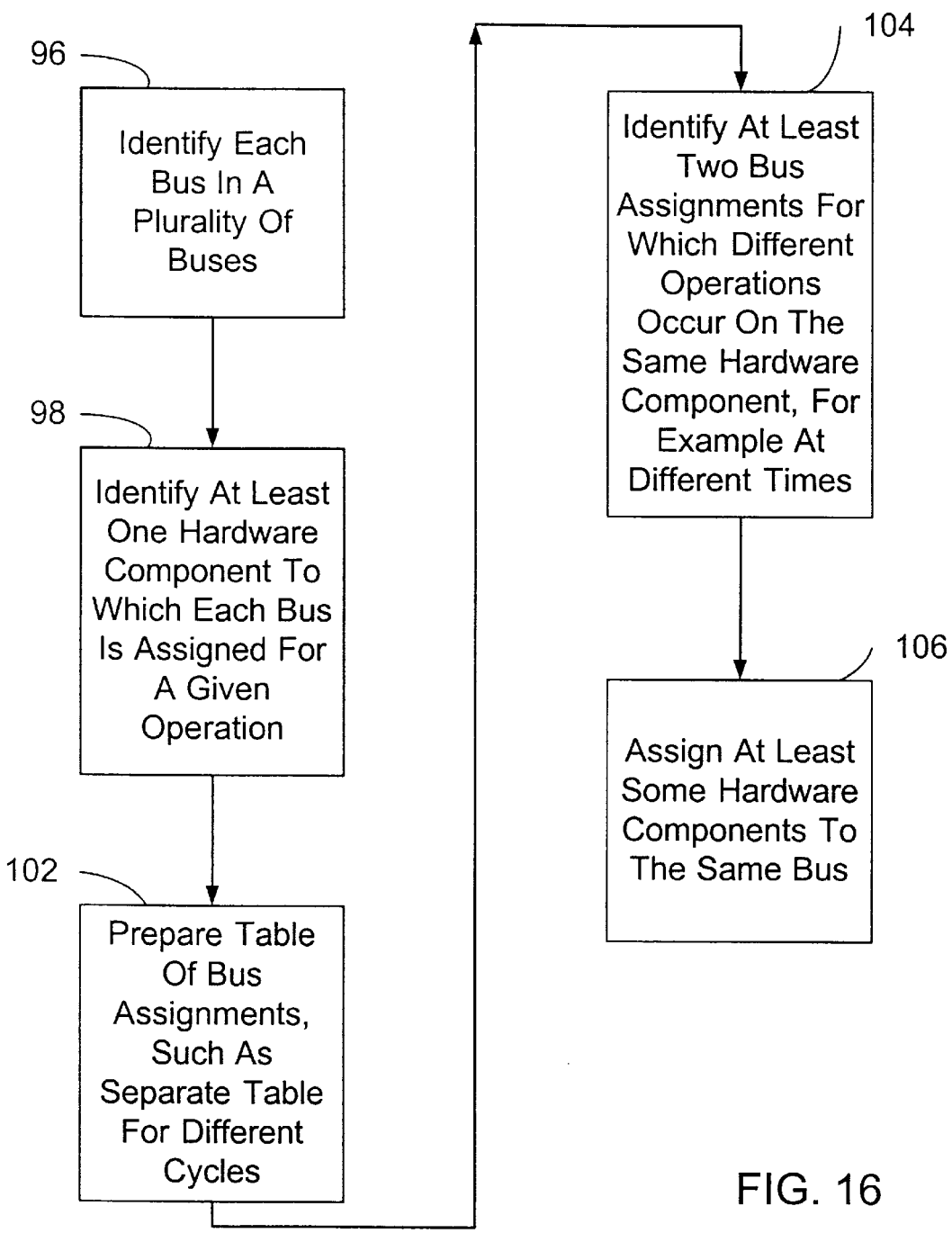
FIG. 16 is a flow chart representing one method or process for the reducing process depicted in FIG. 15.

Steps that can be followed to minimize the number of bus interconnects as described with respect to FIGS. 7A–7C include identifying each bus in a plurality of busses at step 96 in FIG. 16. The identification of the busses can be developed from the hardware and bus assignment information input to the processor 20. The hardware and bus assignment information may typically be provided from a schedule algorithm such as a modulo scheduler, and represents the hardware components and bus components to be used in the processor to carry out the operations defined by the program code or other instruction language. The busses may be given a designation or representation for purposes of identification. For discussion purposes, the busses for each cycle represented by the arrays in FIGS. 7A–7C are designated Bus 1 and up for a total of B busses. Only eight busses are depicted in FIGS. 7A–C.

For each bus, at least one hardware component is identified corresponding to each bus for a given operation, at step 98 (FIG. 16). If, for all cycles, a bus does not have a hardware component assigned, the scheduler has assigned too many busses. In the arrays of FIGS. 7A–7C, the identification of hardware components corresponding to a data transfer on a bus is indicated by the black dots 100. Each black dot corresponds to a single hardware component U and a given bus B for a given Cycle. A table is prepared, step 102, representing the bus assignments, and may take the form of the arrays depicted in FIGS. 7A–7C. However, in the preferred embodiment, the table of bus assignments is preferably represented by a plurality of matrices, each matrix representing the assignments for a given cycle. The matrix representations are discussed more fully below. Using the table of bus assignments, at least two bus assignments are identified for which "different operations" occur on the same hardware component, step 104. These bus assignments are candidates for optimizing the interconnects between the busses and the corresponding hardware components. For example, where data transfers are scheduled for the same hardware components, such as U4 and U5 in FIGS. 7A–7C, and for different bus numbers, and during different cycles or at different times, the data transfers for hardware components U4 and U5 can all be assigned to the same bus, namely B1. The assignment of at least some of the hardware components to the same bus is represented at step 106 (FIG. 16). As a result, fewer bus interconnects will be made in the final processor than would otherwise have occurred without these optimization steps.

The phrase "different operations" refers to functional operations occurring at different times for the same or different hardware components. "Operation" is a functional operation at a distinct time. Therefore, a data transfer from a given hardware component at a given time will be an operation different from the data transfer from the same hardware component at a different time. The same holds true for transfers to the same hardware component at different times. Data transfers from different hardware components, or to different hardware components, at the same time will be different operations. Data transfers between hardware components at a given time are the same operation. In the preferred embodiment, at least two bus assignments are identified for which different operations occur on the same hardware component. Typically, these operations occur at different times, such as during different cycles. Consequently, no interference would occur for the scheduling of the operations on the same bus.

In one preferred embodiment of the inventions, the identification of busses and hardware components to which the busses are assigned for a given operation is achieved through the use of a table or other representation of the assignment that is generated by a scheduler or other operation between a bus and a given hardware component. The table or other representation is preferably any form which can be manipulated or processed with a computer such as processor 20 to automatically carry out the optimization of the bus interconnects. In one preferred embodiment of the inventions, the table of bus assignments is represented as a group of matrices such as are depicted in FIGS. 9A–9D. Each matrix is preferably a B×U matrix where B is the total number of busses assigned, and U is the total number of hardware components, such as function units and register files, to be incorporated into the processor being designed. Each matrix will be designated by the letter A with a sub script designating the cycle to which the matrix corresponds. Each matrix element is either a 1 or a 0, a 1 indicating an assignment by the scheduler of the bus designated by the row to the hardware unit designated by the column. Therefore, the 1 (108) in the first row in the first column of matrix $A_0$ indicates that the scheduler has assigned a data transfer to occur at Cycle 0 on bus B1 with hardware component U1. $A_0$ indicates that no data transfer has been assigned for the bus and the hardware component corresponding to the row and column, respectively. Matrix $A_0$ in FIG. 9A corresponds to the array 84 in FIG. 7A. Matrix $A_1$ corresponds to the array 86 and FIG. 7B and matrix $A_{II-1}$ corresponds to the array 94 in FIG. 7C. No array is given which corresponds to matrix $A_2$.

In the preferred embodiment, there would be II matrices, one each corresponding to each cycle in the initiation interval. These matrices thus identify each bus in the plurality of busses B and the hardware components U to which each bus is assigned for a given data transfer. These matrices are also in effect truth tables indicating whether or not an assignment has been made by a scheduler or other operator between a bus and a hardware component. These matrices can then be used to identify bus assignments for which different operations occur on the same hardware components, and therefore which are candidates for optimizing bus interconnects. Once these bus assignments are identified, the interconnects can be combined, linked or otherwise merged, and combinations of hardware components scheduled for data transfers among themselves at different times can be assigned to the same bus.

To find an efficient way of identifying the bus assignments which are candidates for optimization, it is noted that an efficient solution can be derived through common algorithms for solving assignment problems where the initiation interval equals two. For example, where there are only two cycles in the initiation interval, an algorithm for solving assignment problems can be used to determine the optimum bus interconnect configuration to achieve the data transfers defined by the software code to be executed on the processor being designed. To extrapolate to the design where II is greater than 2, a solution is approximated by solving the assignment problem a number of times (FIGS. 17 and 18) to optimize the bus assignment represented by each matrix, after which the optimized bus assignments for each matrix are combined to produce a bus assignment and interconnect configuration for the processor. Additional passes are preferred to optimize the bus connections for each matrix, so that the interconnects are optimized as much as is reasonable under the circumstances.

In one preferred embodiment of the inventions, the method of optimizing the bus interconnects includes preparing (step 110 in FIG. 17) representations of the bus assignments, for example preparing representations of matrices A (FIGS. 9A–9D). A correlation matrix ($A_{co}$ in FIGS. 11 and 17) is produced from two bus assignment matrices $A_0$ and $A_1$ by taking a cross product (116 in FIG. 17) of the first bus assignment matrix ($A_0$) with a transpose of the second matrix, $A_1^T$ (FIG. 10). The correlation matrix is used to solve an assignment problem to optimize the bus assignment (116 FIG. 17). The assignment problem is solved by maximizing the sum of the diagonal of the correlation matrix (see FIG. 11), while permuting the columns of the matrix. In other words, all of the permutations of the data transfer assignments and interconnects for the cycle corresponding to the matrix $A_1$ are analyzed, in order to maximize the sum of the diagonal of the correlation matrix $A_{co}$. Those skilled in the art will recognize that the actual process of maximizing the values on the diagonal can be achieved in a number of ways, but preferably by permuting (117) the columns of the correlation matrix $A_{co}$ to find the maximum for the trace of the correlation matrix $A_{co}$. Once the desired permutation is found, the corresponding permuted matrix for the cycle under consideration is determined from the permuted correlation matrix (118), and stored. The result is stored (121, FIG. 17) as the optimum permuted bus assignment for the second matrix ($A_1^P$). It should be noted that in the first pass, the matrix $A_1$ is optimized only relative to the unpermuted bus assignment for the first matrix $A_0$. However, the second pass will permute the $A_0$ bus assignments.

Figure 17:
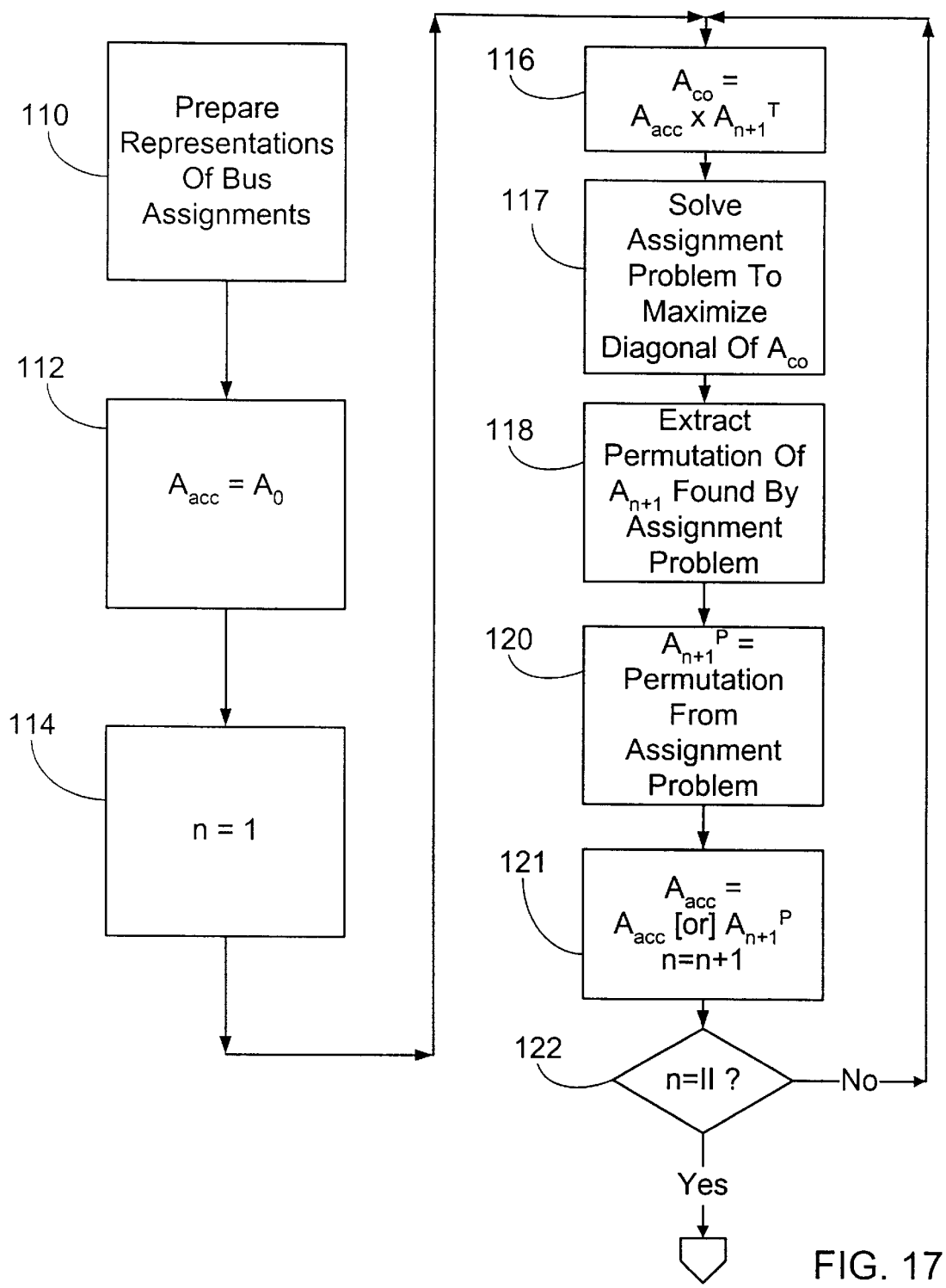
FIG. 17 is a flow chart representing one method for optimizing bus interconnects by solving an assignment problem in accordance with one aspect of the present inventions.

An accumulation matrix $A_{acc}$ is first initialized at 112 (FIG. 17) and thereafter is updated at step 121 by OR-ing together the first permuted matrix ($A_1^P$) from step 120 and the original matrix ($A_0$). This accumulation matrix is then used to calculate a new correlation matrix (returning to 116 after testing 122 for the end of the sequence) along with the transpose of the next matrix ($A_{n+1}$). The permutations of the next matrix are then evaluated in the same way using the assignment problem algorithm (117) until the permuted matrix is optimized and stored. The newly permuted matrix is then OR-ed (121) with the accumulation matrix $A_{acc}$ to obtain a new accumulation matrix. The accumulation matrix tracks the optimization results of the permutations in the preceding steps and updates the matrix so that each successive correlation matrix is current. The accumulation matrix is used in the rest of the first pass to optimize the remaining bus assignment matrices by repeatedly solving the assignment problem algorithm (117; FIG. 17). Specifically, throughout the rest of the first pass (FIG. 17), an updated accumulation matrix is generated at each step by Or-ing together the optimized matrices and the starting matrix. It is believed that during the first pass, the accumulation matrix represents a gradually increasing quality combination of the previously optimized bus assignments.

An example of an improved correlation matrix developed by permuting the bus assignment data for a given matrix can be seen by comparing the results of the correlation matrices in FIG. 11 and FIG. 13. The correlation matrix of FIG. 11 is derived from the cross product of the first matrix $A_0$ (FIG. 9A) with the transpose of the second matrix (FIG. 10). The cross product producing the accumulation matrix in FIG. 11 does not have any bus assignments in common between the two matrices, as evidenced by the diagonal containing all zeros. However, if the second matrix $A_1$ (FIG. 9B) is permuted and re-transposed (FIG. 12B), the new bus B1 (the first column 124 of the transposed matrix) has values indicating assignments that are common with bus B1 in the first matrix $A_0$. As a result, the sum of the digits along the diagonal of the correlation matrix in FIG. 13 is greater than that for the correlation matrix in FIG. 11. Therefore, permuting matrix $A_1$ improved the bus assignment configuration for the second cycle, and will reduce the number of redundant connections to the busses. Additionally, it is relatively trivial to demonstrate that when the permutation is found, the permutation maximizes the number of connections that are already made and that it is the sum of the diagonal values in the permuted matrix.

Assuming that the permuted second matrix represented by the transpose in FIG. 12B is the optimum bus assignment configuration for the second cycle, the permuted matrix is then OR-ed with the first matrix to produce the accumulation matrix 126 shown in FIG. 14. The bus assignments of this accumulation matrix represent the combined bus assignments derived from the first matrix and the permuted second matrix.

After the second matrix of each cross product is optimized, the optimized matrix is stored. The resulting optimized matrices represent an improved bus assignment for the hardware components for each cycle relative to the initial bus assignment configuration. However, it has been found that a second pass (FIG. 18) yields significantly improved results for bus assignments.

Figure 18:
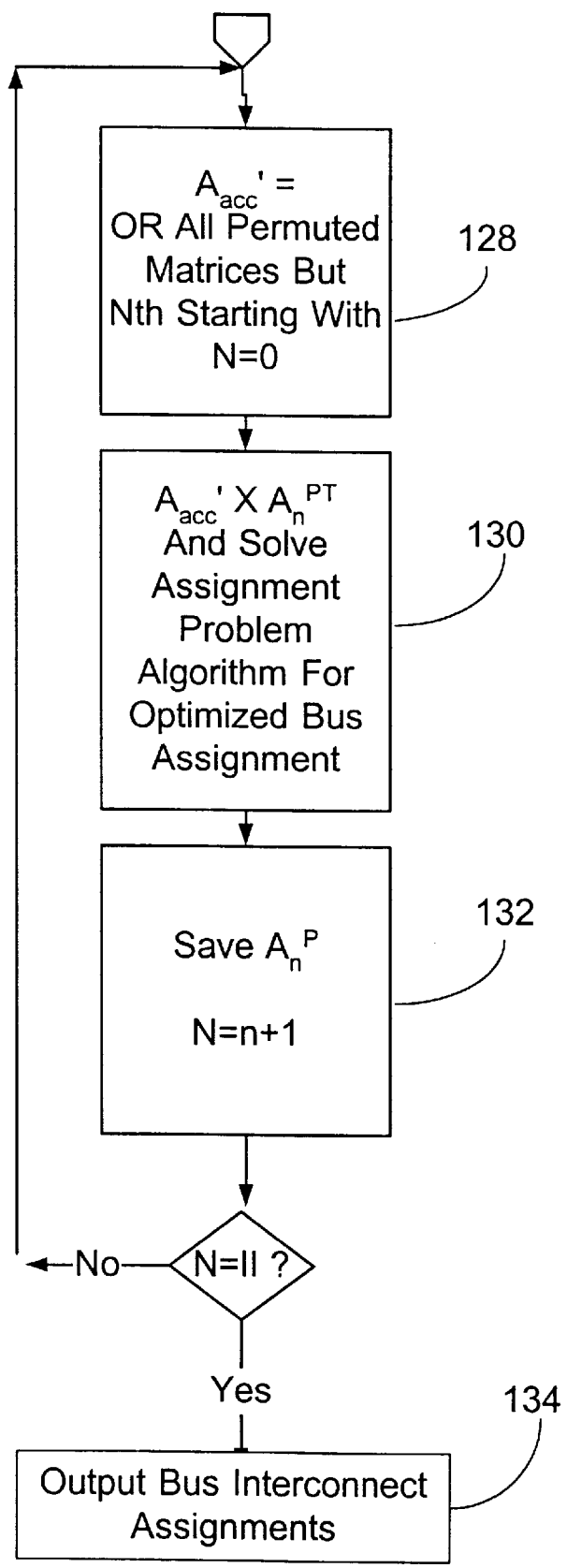
FIG. 18 is a flow chart representing a further method for optimizing bus interconnects in accordance with a further aspect of the present inventions.

During the second pass, a second accumulation matrix is derived by OR-ing all of the permuted matrices except for the first matrix (128; FIG. 18). The second accumulation matrix is then multiplied by the transpose of the first matrix in order to optimize the bus assignment configuration represented by the first matrix. The optimization occurs in the same manner as described with respect to the first pass, namely by solving the assignment problem algorithm for the product of the new accumulated matrix and the transpose of the first matrix (1 30; FIG. 18). The bus definitions represented by the columns in the transposed matrix are permuted until the optimum bus assignments for the first matrix are found. The permuted bus assignments for the first matrix are then stored (132; FIG. 18). The second accumulation matrix is then recalculated at 128 using the new permuted first matrix and all of the other permuted matrices except for the permuted second matrix from the first pass. The second matrix is then optimized (130) relative to the new second accumulation matrix and then stored (132). All of the remaining permuted matrices are re-optimized in the second pass in the same manner (FIG. 18). The permuted matrices are then output (134), representing optimized bus assignments for each cycle in the initiation interval. The output can be combined into a single definition of the bus interconnects with the hardware components and thereafter used to create a hardware definition language along with the function unit assignments and schedule. Alternatively, the optimized bus assignments can be stored for later use in creating a hardware description language for the processor.

Optimization of the bus assignments produces a more efficient bus interconnect configuration, resulting in a processor that is less expensive to produce. Using an algorithm for solving assignment problems in this context of optimizing bus interconnect configurations leads to a less time-consuming and to a more efficient method for designing processors. This is especially applicable to design of processors using software pipelined data paths.

Having thus described several exemplary implementations of the invention, it will be apparent that various alterations and modifications can be made without departing from the inventions or the concepts discussed herein. Such operations and modifications, though not expressly described above, are nonetheless intended and implied to be within the spirit and scope of the inventions. Accordingly, the foregoing description is intended to be illustrative only.

What is claimed is:

1. A method of assembling a set of hardware components and bus assemblies, the method comprising the steps of:
    an identifying step identifying each bus in a plurality of busses and at least one hardware component to which each bus is assigned for a given operation;
    another identifying step identifying at least two bus assignments for which different operations occur on the same hardware component; and
    assigning at least some of the hardware components for which different operations occur on the same hardware component to the same bus.

2. The method of claim 1 where in the second recited identifying step includes the step of identifying at least two bus assignments for which different operations occur on the same hardware component at different times.

3. The method of claim 1 wherein the first recited identifying step includes the step of preparing a table of bus assignments.

4. The method of claim 3 wherein the step of preparing a table includes the step of preparing a plurality of matrices representing bus assignments.

5. The method of claim 4 wherein the step of preparing a table includes the step of comparing different matrices corresponding to different cycle times.

6. The method of claim 4 wherein the step of assigning includes the step of solving an assignment problem algorithm.

7. The method of claim 6 wherein the step of solving includes the step of permuting bus assignments in the table of bus assignments.

8. The method of claim 4 further comprising the steps of calculating a cross product of a first matrix and the transpose of a second matrix and maximizing the sum of values on the diagonal of the resultant matrix.

9. The method of claim 8 wherein the step of maximizing includes the step of permuting representations of bus assignments for the second matrix.

10. The method of claim 9 further comprising the step of saving a permuted matrix.

11. The method of claim 10 further comprising the step of determining an accumulation matrix representing a combination of at least two bus assignment matrices.

12. The method of claim 11 wherein the step of determining an accumulation matrix includes the step of Or-ing a permuted matrix with another matrix.

13. The method of claim 12 wherein the step of calculating a cross product includes the step of calculating a cross product for every matrix representing a bus assignment, and wherein the step of determining an accumulation matrix includes the step of determining an accumulation matrix using each permuted matrix.

14. The method of claim 9 wherein the step of maximizing includes the step of determining an accumulation matrix from a plurality of permuted matrices and maximizing a cross product between a permuted matrix and the accumulation matrix determined from the plurality of permuted matrices.

15. A method of selecting a set of hardware component and bus assembly interconnections, the method comprising the steps of:
    identifying each bus in a plurality of busses and at least one hardware component to which each bus is assigned for a given operation, and representing each bus and the respective assigned hardware component in a table;
    identifying for each bus in the plurality of busses a time in a sequence of times when the bus is to be connected to the hardware component; and
    combining at least two busses that are connected to the same hardware component at different times into a single bus.

16. The method of claim 15 wherein the step of combining includes the step of permuting the representations of each bus in the table.

17. The method of claim 15 further comprising the step of representing each bus and hardware components in discrete tables representing different cycle times.

18. A system for selecting a set of hardware components and bus assembly interconnections, the system comprising:
    a processor containing an algorithm for solving assignment problems;
    means for identifying a plurality of bus assignments corresponding to hardware components and permuting the bus assignments for optimizing the number of bus assignments corresponding to hardware components; and
    producing representations of bus assignments corresponding to hardware components.

* * * * *